(12) United States Patent
Hsu et al.

(10) Patent No.: US 7,355,872 B2
(45) Date of Patent: Apr. 8, 2008

(54) SEGMENTED CONTENT ADDRESSABLE MEMORY ARCHITECTURE FOR IMPROVED CYCLE TIME AND REDUCED POWER CONSUMPTION

(75) Inventors: Louis L. Hsu, Fishkill, NY (US); Brian L. Ji, Fishkill, NY (US); Li-Kong Wang, Montvale, NJ (US)

(73) Assignee: International Business Machines Corporation, Armonk, NY (US)

(*) Notice: Subject to any disclaimer, the term of this patent is extended or adjusted under 35 U.S.C. 154(b) by 348 days.

(21) Appl. No.: 10/673,801

(22) Filed: Sep. 29, 2003

(65) Prior Publication Data

US 2005/0071544 A1   Mar. 31, 2005

(51) Int. Cl.
*G11C 15/04* (2006.01)
(52) U.S. Cl. .................. 365/49; 365/189.08; 365/233; 365/230.03
(58) Field of Classification Search .................. 365/49, 365/230.03, 189.08, 233, 195
See application file for complete search history.

(56) References Cited

U.S. PATENT DOCUMENTS

| | | | | |
|---|---|---|---|---|
| 5,517,441 A | * | 5/1996 | Dietz et al. | 365/49 |
| 5,706,224 A | * | 1/1998 | Srinivasan et al. | 365/49 |
| 6,341,079 B1 | * | 1/2002 | Chadwick | 365/49 |
| 6,452,822 B1 | * | 9/2002 | Chai et al. | 365/49 |
| 6,760,242 B1 | * | 7/2004 | Park et al. | 365/49 |
| 6,804,134 B1 | * | 10/2004 | Proebsting et al. | 365/49 |
| 6,829,153 B1 | * | 12/2004 | Park et al. | 365/49 |
| 6,965,519 B1 | * | 11/2005 | Park et al. | 365/49 |
| 2003/0123269 A1 | * | 7/2003 | Gillingham et al. | 365/49 |

* cited by examiner

*Primary Examiner*—Andrew Q. Tran
(74) *Attorney, Agent, or Firm*—Robert M. Trepp; F. Chau & Associates, LLC (57) ABSTRACT

A content addressable memory ("CAM") system includes a plurality of segments arranged in an array, wherein each of the plurality of segments includes a plurality of CAM cells, each of the plurality of CAM cells includes a wordline, a matchline and a sinkline, the wordline being shared by all of the cells in the same row, the matchline and sinkline being shared by all of the cells in the same segment; and a corresponding method of searching within a CAM system includes providing an input word to the CAM system, comparing a portion of the input word in a segment of the CAM system, and propagating a mismatch to obviate the need for comparison in other segments of the CAM system.

20 Claims, 7 Drawing Sheets

| | Segment 0<br>1st clock | Segment 1<br>2nd clock | Segment 2<br>3rd clock | Segment 3<br>4th clock | bMATCH |
|---|---|---|---|---|---|
| wordline 0 | Sinkline = 0<br>compare<br>=> mismatch | Sinkline = 1<br>no compare | Sinkline = 1<br>no compare | Sinkline = 1<br>no compare | 1 |
| wordline 1 | Sinkline = 0<br>compare<br>=> match | Sinkline = 0<br>compare<br>=> match | Sinkline = 0<br>compare<br>=> match | Sinkline = 0<br>compare<br>=> mismatch | 1 |
| wordline 2 | Sinkline = 0<br>compare<br>=> match | Sinkline = 0<br>compare<br>=> mismatch | Sinkline = 1<br>no compare | Sinkline = 1<br>no compare | 1 |
| wordline 3 | Sinkline = 0<br>compare<br>=> mismatch | Sinkline = 1<br>no compare | Sinkline = 1<br>no compare | Sinkline = 1<br>no compare | 1 |
| wordline 4 | Sinkline = 0<br>compare<br>=> match | Sinkline = 0<br>compare<br>=> match | Sinkline = 0<br>compare<br>=> match | Sinkline = 0<br>compare<br>=> match | 0 |
| wordline 5 | Sinkline = 0<br>compare<br>=> match | Sinkline = 0<br>compare<br>=> match | Sinkline = 0<br>compare<br>=> mismatch | Sinkline = 1<br>no compare | 1 |
| wordline 6 | Sinkline = 0<br>compare<br>=> mismatch | Sinkline = 1<br>no compare | Sinkline = 1<br>no compare | Sinkline = 1<br>no compare | 1 |
| ...... | | | | | |

| cases for searchline patterns applied to a word | | N-segment architecture Power consumption per cycle | | | Non-segmented architecture Power consumption per cycle | | |
|---|---|---|---|---|---|---|---|
| | | matchline | sinkline | total | matchline | sinkline | total |
| case 1 | continuous all-matching words | 0 | | 0 | 0 | | 0 |
| case 2 | alternating between all matching word and 1st seg mismatch | $CV^2/2$ | $(N-1)*CV^2/2$ | $NCV^2/2$ | $NCV^2/2$ | 0 | $NCV^2/2$ |
| case 3 | alternating between 1st seg mismatch and last-seg-only mismatch | $CV^2$ | $(N-1)*CV^2/2$ | $(N+1)*CV^2/2$ | $NCV^2$ | 0 | $NCV^2$ |
| case 4 | random distributed one-seg-only mismatch | $CV^2$ | $\sim NCV^2/6$ for large N | $(1+N/6)CV^2$ for large N | $NCV^2$ | 0 | $NCV^2$ |
| case 5 | random data | $CV^2$ | $\sim 0$ | $\sim CV^2$ | $NCV^2$ | 0 | $NCV^2$ |
| case 6 | mismatch concentrated in one segment | $CV^2$ | $\sim 0$ | $\sim CV^2$ | $NCV^2$ | 0 | $NCV^2$ |
| case 7 | random distributed first mismatched seg | $CV^2$ | $\sim NCV^2/6$ for large N | $(1+N/6)CV^2$ for large N | $NCV^2$ | 0 | $NCV^2$ |

SEGMENTED CONTENT ADDRESSABLE MEMORY ARCHITECTURE FOR IMPROVED CYCLE TIME AND REDUCED POWER CONSUMPTION

BACKGROUND OF THE INVENTION

The present invention relates generally to integrated circuit content addressable memory devices.

Advancements in telecommunication technology have led to an increasing number of applications using content addressable memory devices ("CAMs"). A CAM associates an address with data. The data are presented on the inputs of the CAM, which searches for a match with those data stored in the CAM. When a match is found, the CAM identifies the address location of the data. For example, a 2K word by 64-bit CAM array has 128K CAM cells on a matrix of 2048 wordlines and 64 bit datalines. If the 64 bit input data match the 64 bit data stored on any given wordline, a match signal will be returned for that particular wordline.

Figure 1:
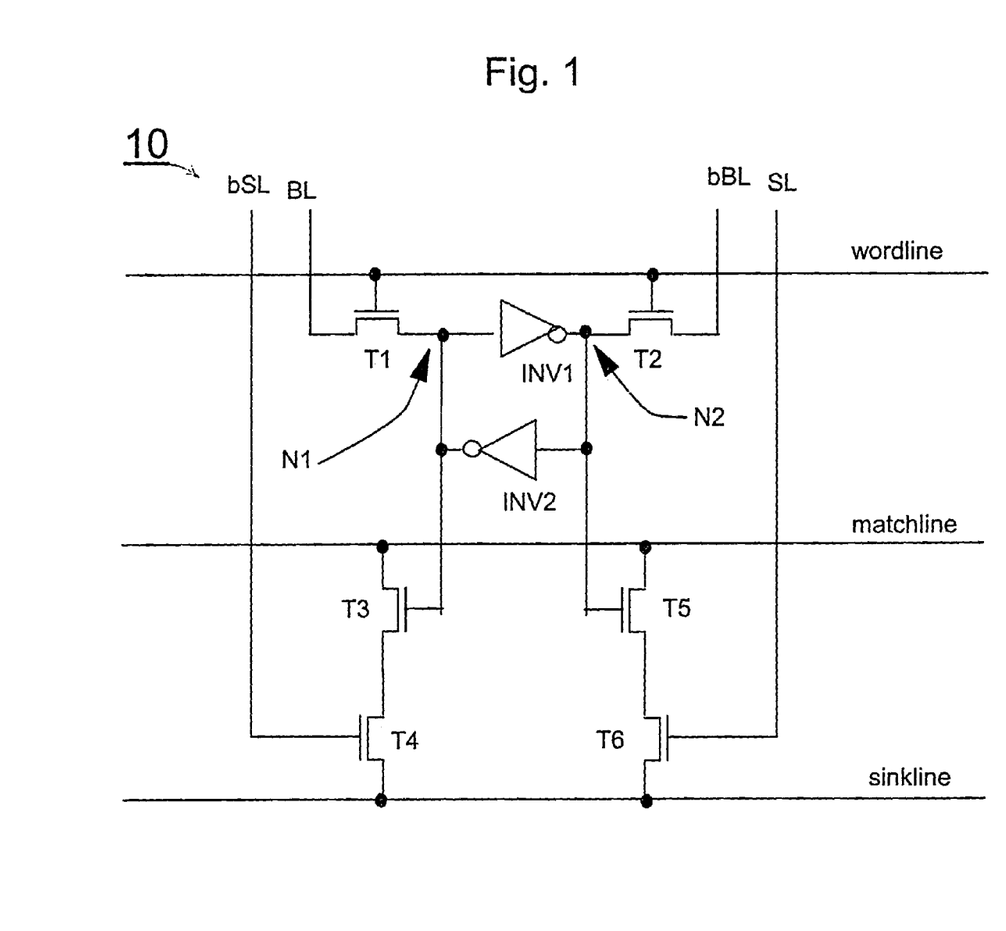
FIG. 1 shows a schematic diagram of a typical SRAM binary content addressable memory ("CAM") cell.

FIG. 1 shows a typical static random access memory ("SRAM") based binary CAM cell, indicated generally by the reference numeral 10. Two inverters, INV1 and INV2, form a latch that stores the true and complimentary data on nodes N1 and N2, respectively. In the write mode, data are written into CAM cells through bitlines, BL and bBL, and through NMOS transistors, T1 and T2, respectively. In the precharge phase of the search mode, the matchline is precharged to high. In the evaluation phase of the search mode, input data presented to the CAM are delivered to the CAM cells through searchlines SL and bSL. When there is a match, the two gates in the path of T3 and T4 as well as in the path of T5 and T6 will have different polarity, so that one of the transistors in each path will be off. Thus, there is no current flowing between the matchline and sinkline through a matched CAM cell. On the other hand, when there is a mismatch, one of the two paths will have both transistors turned on and allow current flow between the sinkline and the matchline. The sinkline is normally connected to ground, and thus, will discharge the match line when a mismatch occurs.

In the above example of a 64 bit wide CAM, each matchline is connected to all sixty-four CAM cells 10. When any of the CAM cells shows a mismatch, the matchline will be discharged to ground. If all sixty-four cells have matches, the matchline will stay at the precharged high level and a match will be found.

A typical search cycle will result in a small number of matching words. Thus, all but a small number of matchlines will be discharged for every search cycle. In addition, each matchline connects to all cells in a wordline, thus its capacitance increases as the CAMs get wider. As the size and width of CAMs increase as required by more applications, the conventional CAM architecture has shown decreased operation speed and increased power consumption. The slow search rate (or search clock cycle time) and large power consumption have become a limiting factor in many applications.

SUMMARY OF THE INVENTION

The above and other drawbacks and deficiencies of the prior art are overcome or alleviated by a CAM system with segmented architecture. The new architecture includes a plurality of segments of sub-arrays. Each segment may perform independent comparison for a subset of data lines in a word. Each segment has its own sets of matchlines and sinklines.

A content addressable memory ("CAM") system includes a plurality of segments arranged in an array, wherein each of the plurality of segments includes a plurality of CAM cells, each of the plurality of CAM cells includes a wordline, a matchline and a sinkline, the wordline being shared by all of the cells in the same row, the matchline and sinkline being shared by all of the cells in the same segment; and a corresponding method of searching within a CAM system includes providing an input word to the CAM system, comparing a portion of the input word in a segment of the CAM system, and propagating a mismatch to obviate the need for comparison in other segments of the CAM system.

Embodiments of the present disclosure also have pipelined logic blocks in communication between the different segments, as well as a progressive search method to propagate mismatching information through different segments for a final matching signal on the full data width. The search clock cycle time of the system is significantly improved due to the reduced capacitance of the now separate and independently controlled segments.

An aspect of system embodiments is the significantly reduced power consumption. During the progressive search, when once a mismatch is found for a segment, further search in different segments on the same word will not be performed. In a preferred embodiment, making the sinkline in the next segment high disables the further search.

DETAILED DESCRIPTION OF PREFERRED EMBODIMENTS

A segmented content addressable memory architecture is provided, in which a reduced capacitance per segment leads to a significantly improved search clock cycle time and bandwidth. A progressive search method significantly reduces the power consumption of segmented content addressable memory devices ("CAMs") in accordance with the present disclosure.

The concept discussed here can be applied to any type of cell architecture including SRAM, DRAM or flash memory based CAMs, or any type of configurations including binary, ternary and other CAMs. For ease of illustration, an exemplary embodiment is illustrated in a binary SRAM based CAM. In the following exemplary embodiment, the width of the data lines is assumed to be 64 bits and the number of words is assumed to be 2048.

Figure 2:
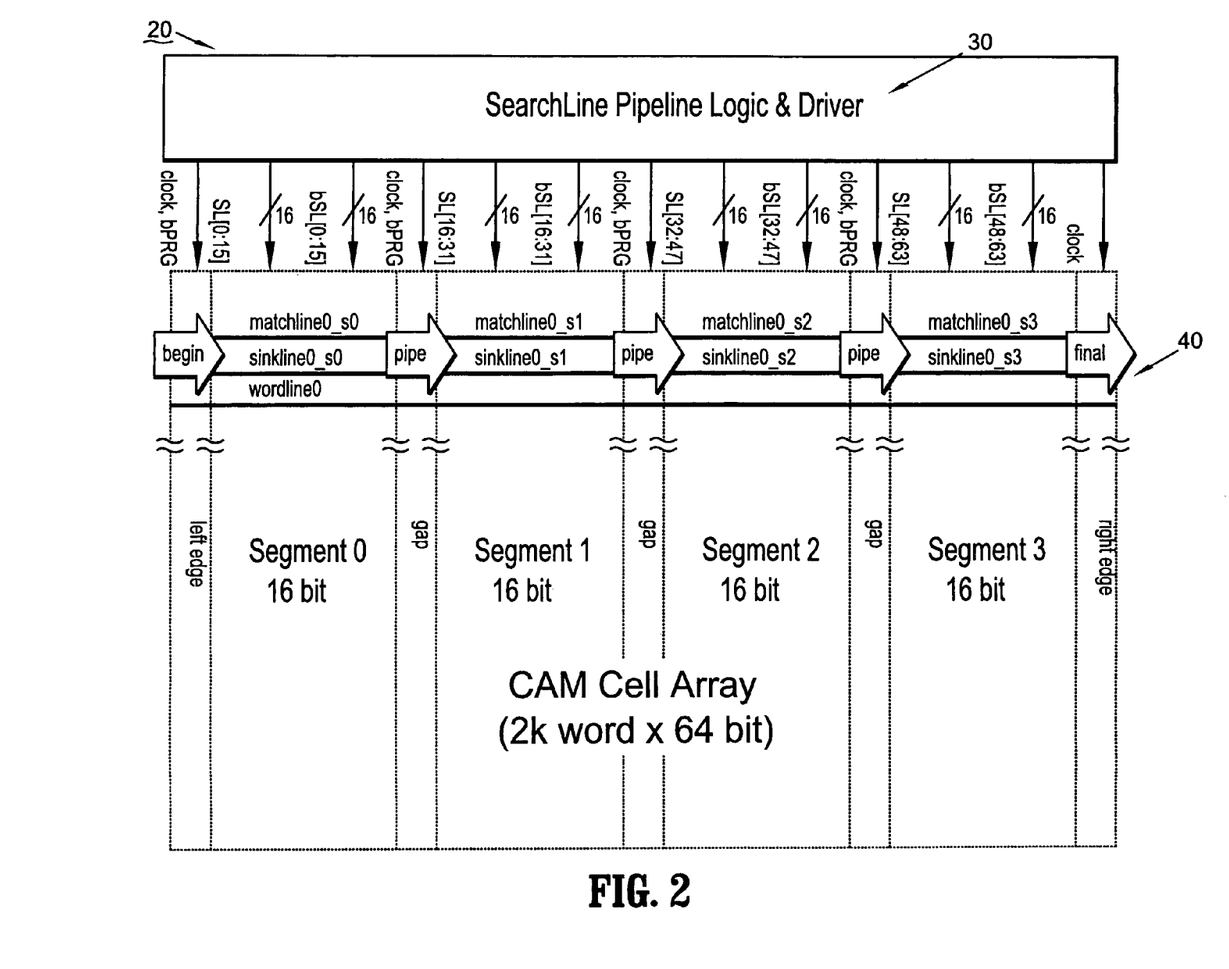
FIG. 2 shows a schematic diagram of an exemplary 2k word by 64-bit CAM with four 16-bit segments.

As shown in FIG. 2, a CAM is indicated generally by the reference numeral 20, and comprises a-searchline pipeline logic and driver 30, and 2 k word by 64 bits cell array 40. The cell array further comprises four 16-bit wide segments of sub arrays, left edge, right edge, and gap blocks between segments. True and complimentary searchlines SL[0:15] and bSL[0:15] are delivered to segment 0, and SL[16:31] and bSL[16:31] to segment 1, SL[32:47] and bSL[32:47] to segment 2, and SL[48:63] and bSL[48:63] to segment 3. The left edge, right edge, and gaps also receive clock and precharge timing signal (bPRG). For wordline0, there are four segmented matchlines, i.e., matchline0_s0 for segment 0, matchline0_s1 for segment 1, matchline0_s2 for segment 2, and matchline0_s3 for segment 3. In addition, for wordline0, there are four segmented sinklines, i.e., matchline0_s0 for segment 0, matchline0_s1 for segment 1, matchline0_s2 for segment 2, and matchline0_s3 for segment 3. The "begin" block in the left edge of the cell array drives the matchlines and sinklines in segment 0. The "pipe" block in the gap area between two adjacent segments drives the matchlines and sinklines from one block to the next using a progressive search method. There is also a "final" block for receiving the matchlines and sinklines in the last segment.

Figure 3:
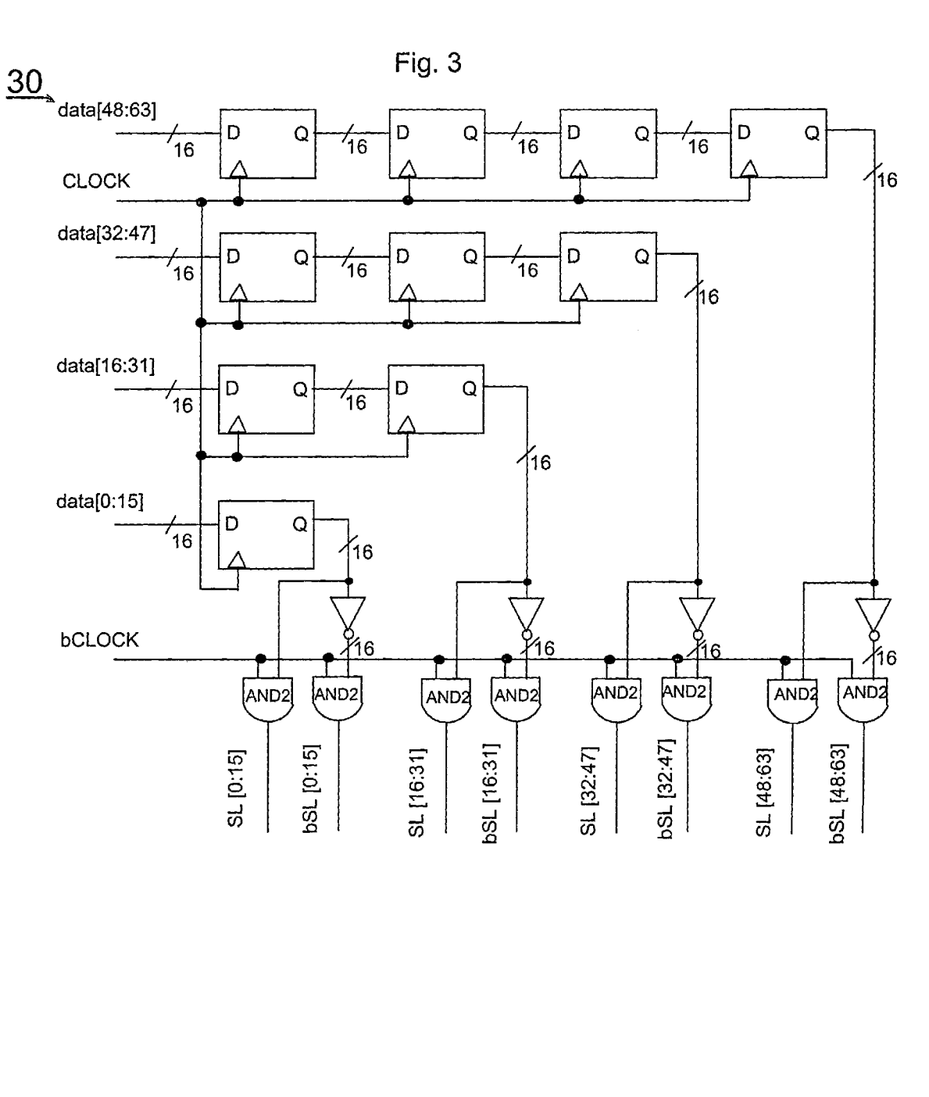
FIG. 3 shows a schematic diagram for searchline pipeline logic and driver.

Turning to FIG. 3, a searchilne pipeline logic and driver block circuit is indicated generally by the reference numeral 30. Positive edge triggered D flip-flops are used to pipeline the 64 bit wide data into a CAM array with a synchronization clock. The first half of the clock cycle the precharge phase where both SL and bSL are set to low (i.e., ground) by AND2 devices with signal bCLOCK as one of its inputs, to shut off the comparison in the CAM array. The second half of the clock cycle is the evaluation or comparison phase where the data to be searched are delivered on searchlines SLs and bSLs. SL[0:15] and bSL[0:15] are delayed from data[0:15] by one clock cycle, SL[16:31] and bSL[16:31] are delayed from data[16:31] by two clock cycles, SL[32:47] and bSL[32:47] are delayed from data[32:47] by three clock cycles, and finally, SL[48:63] and bSL[48:63] are delayed from data[48:63] by four clock cycles. Thus the comparison on each 16-bit segment of a word in the CAM array will be completed sequentially. A set of timing diagrams for SLs and bSLs is indicated generally by the reference numeral 600 of FIG. 6, as discussed below. The timing diagrams 600 include three continuous data sets for comparison purposes.

Figure 4:
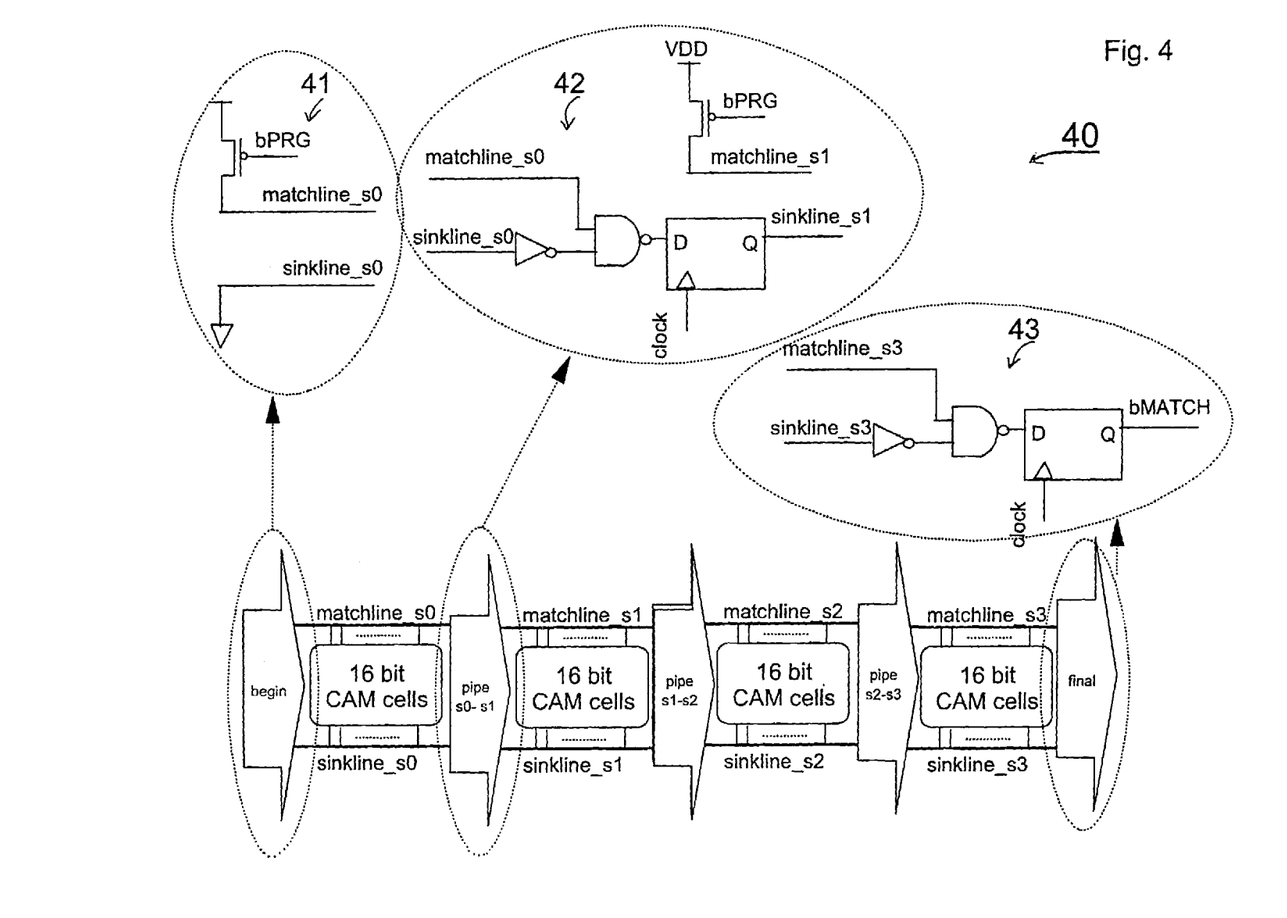
FIG. 4 shows a schematic block diagram for one word comparison, including "begin", "pipe" and "final" blocks used in a progressive search method for a segmented CAM.

As shown in FIG. 4, a CAM array block is indicated generally by the reference numeral 40. Operation for one word is shown for illustration. As described above, each 64-bit word is compared in four 16-bit segments sequentially. In "begin" 41, matchline_s0 in segment 0 is precharged to high in a precharge phase, and sinkline_s0 in segment 0 is connected to low (ground). Therefore the comparison operation will always be performed for the first segment (i.e. segment 0) in the first clock cycle. If there is a mismatch for any word in segment 0, the matchline_s0 (which is the matchline for segment 0) corresponding to the mismatched word will be discharged to ground. Once there is a segmental mismatch for a particular wordline, the progressive search scheme will stop further comparison for that wordline in other segments since the word is already a mismatch regardless of the results in the other segments. In the meantime, the information of a first mismatch is passed along on the sinklines in the later segments by bringing those sinklines high.

In the preferred embodiment, this is achieved in "pipe s0-s1" as shown in FIG. 4 where at the positive edge of the clock, a low (ground) for matchline_s0 will latch a high on sinkline_s1 for segment 1, therefore segment 1 will not be compared. Similarly, "pipe s1-s2" is implemented between segment 1 and segment 2, where at the positive edge of the clock, the output of the D flip-flop will latch a high on sinkline_s2 for segment 2 if (1) matchline_s1 is low, i.e. a mismatch resulted from a comparison in segment 1; or (2) sinkline_s1 is high, i.e., a no comparison in segment 1 because of a mismatch in an earlier segment. On the other hand, if a comparison was done in segment 1 (i.e. sinkline_s1 is low) and matchline_s1 remains high near the end of the cycle, the D flip-flop will latch a low on sinkline_s2. Therefore comparison will continue if all previous segments are found to be matched. Similar "pipe s2-s3" is implemented between segment 2 and segment 3. A "final" block is implemented after segment 3, where signal bMATCH will be latched to a high to indicated a mismatch, if (1) at the positive edge of the clock, matchline_s3 is low, i.e. a mismatch resulted from a comparison in the final segment (segment 3); or (2) sinkline_s1 is high, i.e., a no comparison in the final segment because of a mismatch in an earlier segment. If neither case (1) or (2) in the above sentence is true, it means each segment of the data has been compared and matched in respective previous cycles, and the corresponding word is a match.

Figure 5:
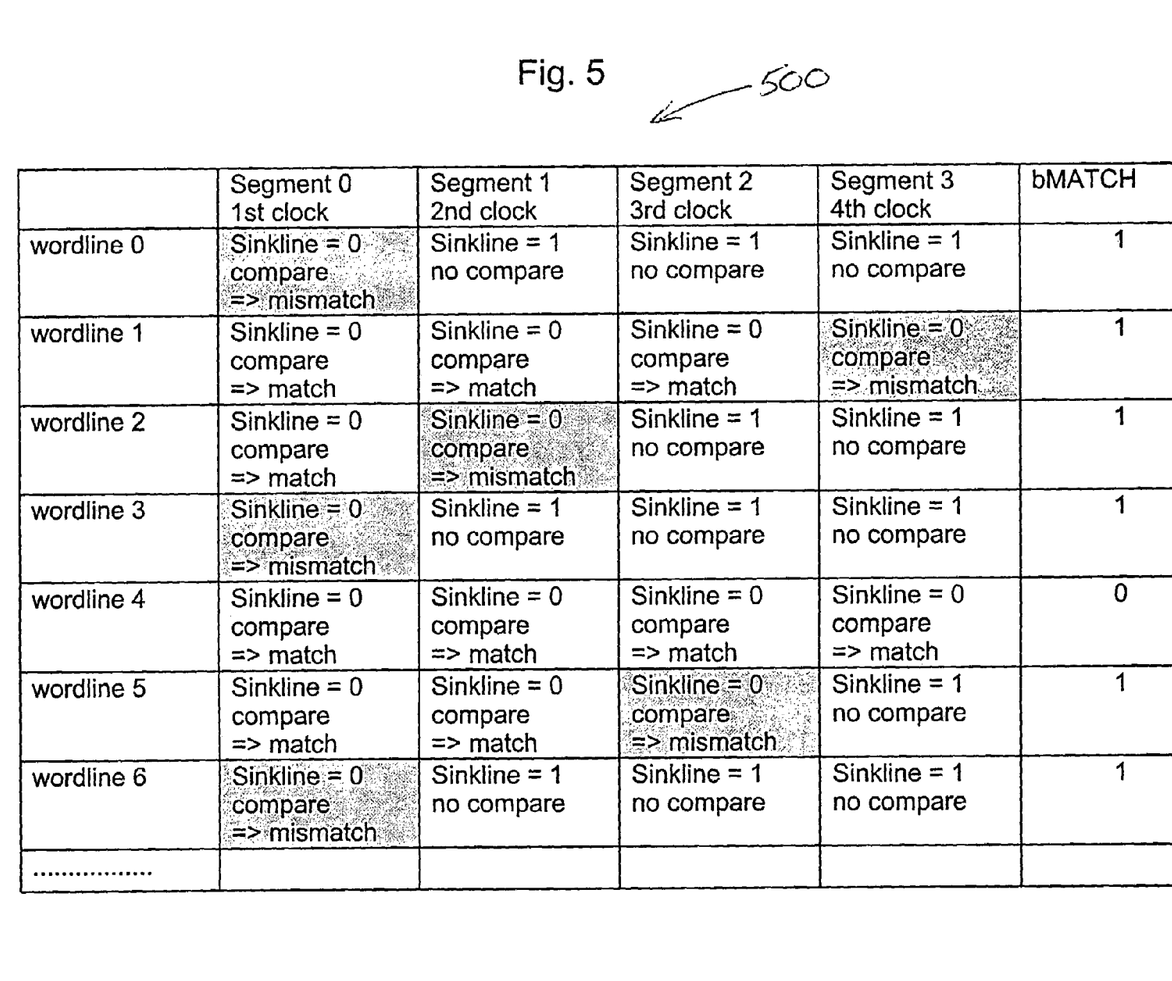
FIG. 5 shows a table of some exemplary segmental search results for several words and the progressive search during different clocks.

Turning to FIG. 5, the above-described progressive search scheme is indicated generally by the reference numeral 500 for several wordlines. First, the full data width for a word is compared in segments at different time, i.e., segment 0 in the first clock, segment 1 in the second clock, segment 2 in the third clock, and segment 3 in the fourth clock. Second, once a mismatch is found in a segment, no comparison will be done for the remaining segments for the corresponding word.

With the segmented scheme, the search clock cycle time is reduced by a factor roughly equaling to the number of segments implemented. Search clock cycle time is defined as the time separation required for issuing consecutive new search commands. Search clock cycle time corresponds to an effective measure of the available bandwidth for the search operation. Search latency is defined as the time period required from the issue of search command to the time a matched address is sent out. The proposed segmented architecture reduces the search clock cycle time, while maintaining roughly the same latency. When the comparison is done on the segmental level, the speed is much faster, as the segmental matchline capacitance is reduced from the non-segmented matchline significantly, or roughly by the number of segments implemented.

Figure 6:
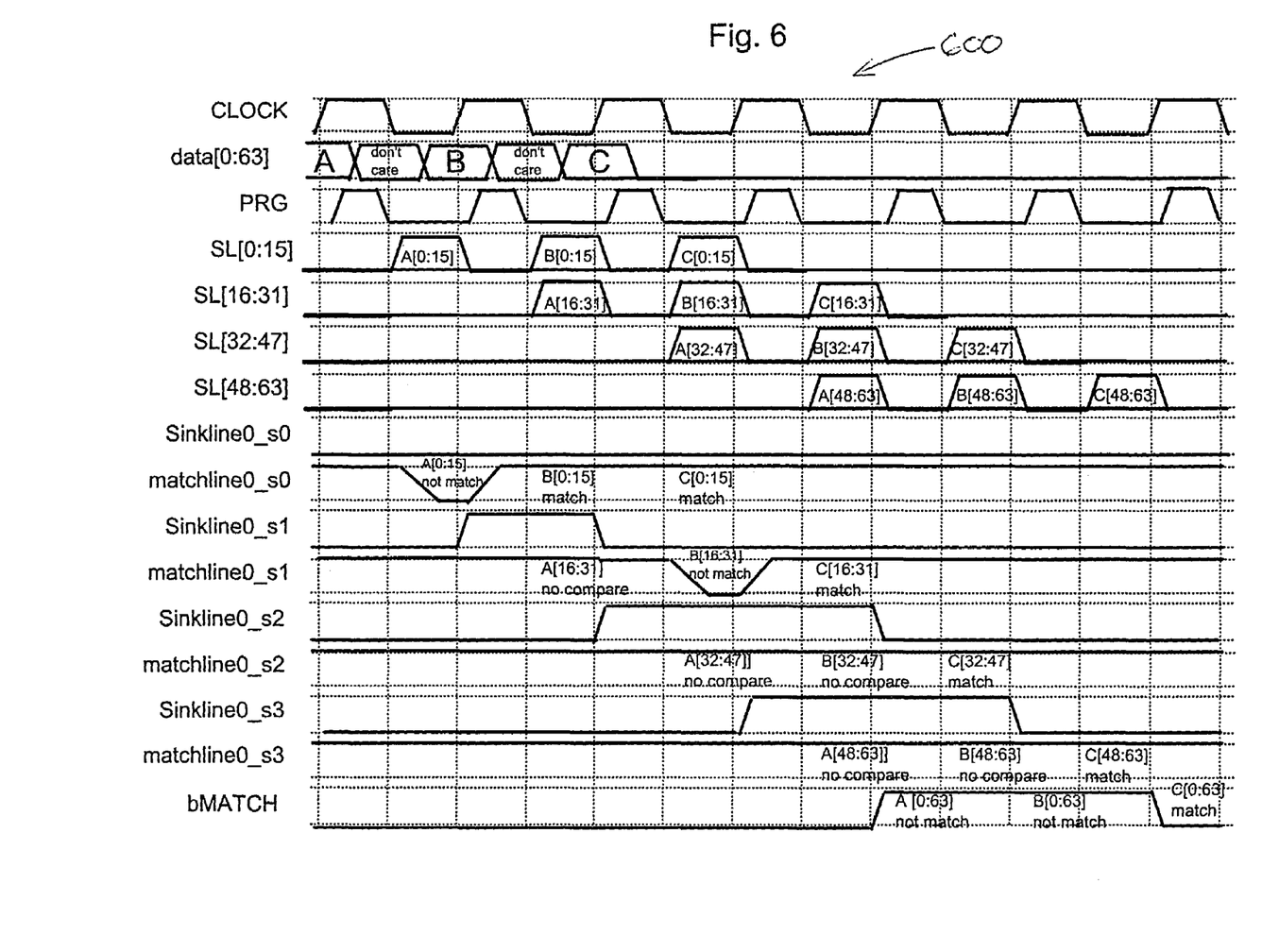
FIG. 6 shows a timing diagram for compare operations with three continuous search data stacked together.

As shown in FIG. 6, a timing diagram for stacked sequential searches is indicated generally by the reference numeral 600. Three sets of data, A[0:63], B[0:63] and C[0:63] are issued consecutively. During the first clock, A[0:15] are delivered to segment 0. During the second clock, B[0:15] are delivered to segment 0, while A[16:31] are delivered to segment 1. During the third clock, C[0:15] are delivered to segment 0, while B[16:31] are delivered to segment 1 and A[32:47] are delivered to segment 2. The data delivered to a particular segment may or may not be compared to the data stored in a particular wordline in the segment, as described in the progressive search method discussed earlier. Similar operation continues for the fourth clock. The bMATCH signal becomes valid for data set A at the fifth clock, valid for data set B at the sixth clock, and valid for data set C at the seventh clock. The cycle time for segmented architecture is reduced by a factor of 4, so is the available bandwidth for search operation. Also note that while 4-segment architecture shows a latency of 4 cycles, each cycle may be ¼ of the cycle required for non-segmented architecture as the capacitance is reduced by a factor of 4. Therefore the total latency for segmented architecture is roughly the same, although it may be slightly more than the non-segmented architecture in practical applications due to more frequent switching. Thus for proposed CAM architecture with N-segments, while the latency may be the same or slightly worse, the cycle time or bandwidth is improved by N times.

Another aspect of the new architecture is significantly reduced power consumption. As discussed earlier, most of the power consumed in conventional non-segmented CAM's search operation is used to discharge the matchlines. In the segment architecture, however, only one segmental matchline need to be discharged. As illustrated in FIG. 5, as described above, any word storing a mismatched data will show only one segmental mismatch, between possibly a number of matches in previous segments and a number of no comparisons in the following segments. Thus, the progressive search scheme reduces the power consumption on the matchline by a factor equaling to the number of segments implemented. However, to give to overall assessment of the power consumption, one must also consider the power consumption on the sinkline.

Figure 7:
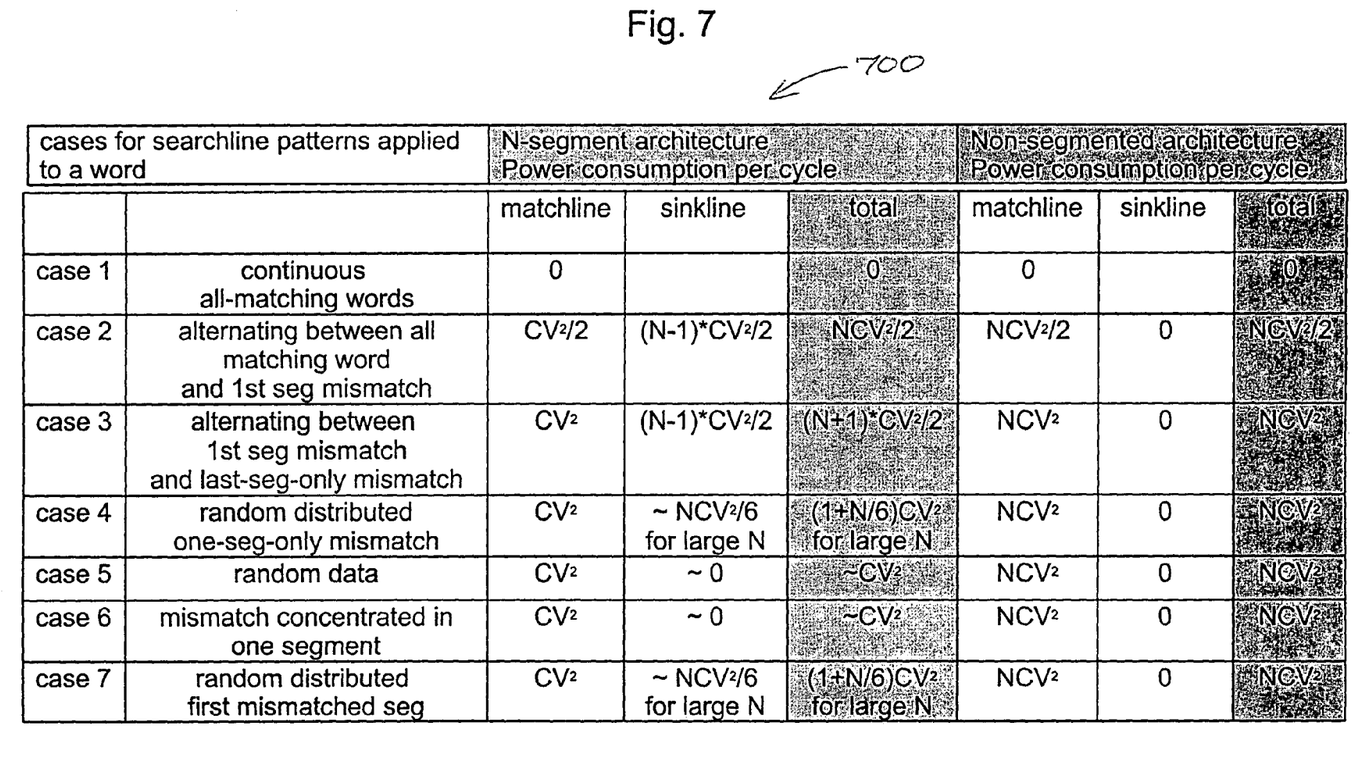
FIG. 7 shows a table for power comparison between N-segmented architecture and non-segmented architecture for the same data width, where is the capacitance for matchline or sinkline for one segment, and V is the supply voltage.

Turning now to FIG. 7, a table summarizing the power comparison between N-segmented architecture and non-segmented architecture for the same data width is indicated generally by the reference numeral 700 for several scenarios of searchline pattern applied to a wordline. Here, C is the capacitance for matchline or sinkline for one segment, and V is the supply voltage. Energy dissipated to charge or discharge a capacitor C is $CV^2/2$. Due to the symmetry of the CAM cell, the capacitance for the matchline and sinkline are assumed to be the same C. Case 1 is continuous all-match words where no power dissipation in either architecture. In case 2, a word is subject to continuous alternating patterns of all-matching and all-but-the-first-segment matching words. For the segmented architecture in case 2, segment 0's matching line is charged and discharged every 2 cycles, thus dissipate a power of $CV^2$ every 2 cycles, or $CV^2/2$ per cycle. Except for the segment 0, the sinkline for all other segments are charged and discharged every two cycles, i.e., (N–1) *$CV^2/2$ per cycle. So the total power dissipation for segmented architecture is $NCV^2/2$ per cycle, which is the same as non-segmented architecture. Since case 1 and case 2 assume either all or every other search line data will match the data stored in a word, it is not a realistic situation for CAMs with large number of wordlines. Case 3 assumes alternating first-seg-mismatch and all-but-last-seg-match patterns. In the segmented architecture, the matchline in first segment is charged and discharged every cycle, and sinkline in all other segments are charged and discharged every two cycle. In the non-segmented architecture, matchlines are charged and discharged every clock cycle. In comparison for case 3, almost a factor of two is achieved, this is because the sinkline is either charged or discharged once every clock cycle, while the matchline need to do both precharge and discharge every cycle. Statistically, cases 1 to 3 are rare events, so now we discuss cases 4 to 7 that are more likely to occur. Case 4 is a more general case where there is a random distributed single-segment mismatches, where the number of sinklines needed to be discharged or charged every clock cycles are $$\frac{\sum_{i=0}^{N-1}\left(\sum_{j=0}^{N-1}|i-j|\right)}{N^2} \approx \frac{N}{3} \text{ for large } N.$$

Therefore for large N, 6 times power saving is achieved in case 4. Case 5 assumes a random data on searchlines. In this case, most words will show mismatch even in the first segment, thus further search will be stopped, and the sinkline for the rest of segment will mostly stay high. The power saving for case 5 is roughly N times where N is the number of segments implemented. Case 6 assumes concentrated data in one segment, which is frequently happened in loop-up table application. The power saving for case 6 is also roughly a factor of N. Case 7 assumes random distributed first-mismatched-segment. While case 4 has only one mismatched segment, case 7 allows multiple mismatched segments and only assumes the first mismatched segment is random distributed. The result for case 7 is the same as case 4 (i.e., a factor of 6 in power savings), due to the progressive search method where further searches need not be performed once there is a mismatched segment. In summary, the segmented architecture has significantly reduced power consumption in search mode.

Although illustrative embodiments have been described herein with reference to the accompanying drawings, it is to be understood that the present invention is not limited to those precise embodiments, and that various changes and modifications may be effected therein by one of ordinary skill in the pertinent art without departing from the scope or spirit of the present invention. All such changes and modifications are intended to be included within the scope of the present invention as set forth in the appended claims.

What is claimed is:

1. A content addressable memory ("CAM") system comprising a plurality of segments arranged in an array, wherein each of the plurality of segments includes a plurality of CAM cells, each of the plurality of CAM cells comprises a wordline, a matchline and a sinkline, each wordline being shared by all of the CAM cells in a same row, each matchline and sinkline being shared by all of the CAM cells in a same segment of the row, wherein each matchline has substantially the same capacitance as each other matchline.

2. A system as defined in claim 1, further comprising gap logic between any two segments to propagate the matchline and sinkline information from segment to segment.

3. A system as defined in claim 1 wherein searching is done in a pipeline process, and when a first segment of a first row is completed in search, the search is continued to proceed to a second segment of the first row, while at the same time, a new search is started to proceed on a first segment of a second row.

4. A system as defined in claim 3 wherein the search procedure on any row will not be continued when a mismatch is detected in any segment of that row.

5. A system as defined in claim 1, each segment comprising substantially the same number of CAM cells as each other segment, a dedicated sinkline and a dedicated matchline connected to each of the CAM cells in the segment, and a flip-flop with output connected to the dedicated sinkline and inputs connected only to a previous segment sinkline, a previous segment matchline, and a same system clock for all segments, respectively.

6. A method of searching within a content addressable memory ("CAM") system, the method comprising:
providing an input word to the CAM system;
comparing a portion of the input word in a segment of the CAM system;
propagating a mismatch to obviate the need for comparison in other segments of the CAM system;
comparing the input word with data from a plurality of wordlines, each wordline being shared by all of the CAM cells in a same row;
propagating a match or mismatch on a matchline, each matchline being shared by all of the CAM cells in a same segment of the row; and
grounding through a sinkline when the mismatch is found in the segment, each sinkline being shared by all of the CAM cells in the same segment,
wherein each matchline has substantially the same capacitance as each other matchline.

7. A method as defined in claim 6, further comprising propagating the matchline and sinkline information from segment to segment through gap logic between each segment and the next segment.

8. A method as defined in claim 6, further comprising:
searching in a pipeline process;
continuing a first search into a second segment of a first row when a first segment of the first row is completed; and
starting a second search to proceed on a first segment of a second row at the same time that the first search is continued into the second segment of the first row.

9. A method as defined in claim 8 wherein the search procedure on any row will not be continued when a mismatch is detected in any segment of that row.

10. A method as defined in claim 6, the segment comprising substantially the same number of CAM cells as each other segment, a dedicated sinkline and a dedicated matchline connected to each of the CAM cells in the segment, and a flip-flop with output connected to the dedicated sinkline and inputs connected only to a previous segment sinkline, a previous segment matchline, and a same system clock for all segments, respectively.

11. A content addressable memory ("CAM") device comprising a plurality of segments arranged in an array, wherein each of the plurality of segments includes a plurality of CAM cells, wherein each of the plurality of CAM cells comprises a wordline, a matchline and a sinkline, the wordline being shared by all of the CAM cells in a same row, the match line and sinkline being shared by all of the CAM cells in a same segment of the row,
wherein each matchline has substantially the same capacitance as each other matchline.

12. A device as defined in claim 11, further comprising gap logic between any two segments to propagate the matchline and sinkline information from segment to segment.

13. A device as defined in claim 11 wherein searching is done in a pipeline process, and when a first segment of a first row is completed in search, the search is continued to proceed to a second segment of the first row, while at the same time, a new search is started to proceed on a first segment of a second row.

14. A device as defined in claim 13 wherein the search procedure on any row will not be continued when a mismatch is detected in any segment of that row.

15. A device as defined in claim 11, each segment comprising substantially the same number of CAM cells as each other segment, a dedicated sinkline and a dedicated matchline connected to each of the CAM cells in the segment, and a flip-flop with output connected to the dedicated sinkline and inputs connected only to a previous segment sinkline, a previous segment matchline, and a same system clock for all segments, respectively.

16. A content addressable memory ("CAM") device comprising:
searching means for searching within the CAM device;
receiving means for providing an input word to the CAM device;
first comparing means for comparing a portion of the input word in a segment of the CAM device;
propagating means for propagating a mismatch to obviate a need for comparison in other segments of the CAM device;
a plurality of second comparing means for comparing the input word with data from a plurality of wordlines, each wordline being shared by all of the CAM cells in a same row;
matching means for propagating a match or mismatch on a matchline, each match line being shared by all of the CAM cells in a same segment of the row; and
grounding means for grounding through a sinkline when the mismatch is found in the segment, each sinkline being shared by all of the CAM cells in the same segment,
wherein each matchline has substantially the same capacitance as each other matchline.

17. A device as defined in claim 16, further comprising:
gap logic means between each segment for propagating the matchline and sinkline information from segment to segment.

18. A device as defined in claim 16, further comprising:
pipeline means for searching in a pipeline process;
continuation means for continuing a first search into a second segment of a first row when a first segment of the first row is completed; and
synchronization means for starting a second search to proceed on a first segment of a second row at the same time that the first search is continued into the second segment of the first row.

19. A device as defined in claim 18, further comprising:
mismatching means wherein the search procedure on any row will not be continued when a mismatch is detected in any segment of that row.

20. A device as defined in claim 16, the segment comprising substantially the same number of CAM cells as each other segment, a dedicated sinkline and a dedicated matchline connected to each of the CAM cells in the segment, and a flip-flop with output connected to the dedicated sinkline and inputs connected only to a previous segment sinkline, a previous segment matchline, and a same system clock for all segments, respectively.

* * * * *